US006653853B1

(12) United States Patent
Cheng

(10) Patent No.: US 6,653,853 B1
(45) Date of Patent: Nov. 25, 2003

(54) MULTIPLE TEST PROBE SYSTEM AND METHOD

(76) Inventor: David Cheng, 711 Hibernia Ct., Sunnyvale, CA (US) 94087

( * ) Notice: Subject to any disclaimer, the term of this patent is extended or adjusted under 35 U.S.C. 154(b) by 0 days.

(21) Appl. No.: 10/066,391

(22) Filed: Feb. 1, 2002

Related U.S. Application Data

(63) Continuation-in-part of application No. 09/348,751, filed on Jul. 6, 1999, now Pat. No. 6,366,103.

(51) Int. Cl.[7] .......................... G01R 1/073; G01R 31/02
(52) U.S. Cl. ........................................ 324/754; 324/758
(58) Field of Search ................................ 324/754, 758, 324/760, 765, 158.1; 335/259, 268; 341/151

(56) References Cited

U.S. PATENT DOCUMENTS

| 1,367,285 A | * | 2/1921 | Stimmel | 324/550 |
|---|---|---|---|---|
| 1,938,899 A | * | 12/1933 | Gilman | 178/33 R |
| 2,438,985 A | * | 4/1948 | Ambrose | 335/256 |
| 2,478,999 A | * | 8/1949 | Briseno | 324/550 |
| 3,449,604 A | * | 6/1969 | Wagner | 310/14 |
| 5,099,199 A | * | 3/1992 | Carter | 324/550 |
| 5,469,064 A | * | 11/1995 | Kerschner et al. | 324/537 |

* cited by examiner

Primary Examiner—Ernest Karlsen
(74) Attorney, Agent, or Firm—Perkins Coie LLP

(57) ABSTRACT

A multiple test probe system is disclosed. The multiple test probe system includes a support and a mount pivotally coupled to the support. The mount is capable of pivoting to a number of testing positions. A number of probe assemblies are coupled to the mount and associated with a corresponding number of testing positions. The probe assemblies include a number of electrical contacts coupled to a number of wires in a probe bus regardless of a testing position of the mount. The multiple test probe system further includes an indexing device coupled to the mount to cause the mount to move between the testing positions, whereby the indexing device is a multiple linear actuator assembly.

16 Claims, 9 Drawing Sheets

MULTIPLE TEST PROBE SYSTEM AND METHOD

CROSS REFERENCE TO RELATED APPLICATIONS

This application is a continuation in part of U.S. patent application Ser. No. 09/348,751, now U.S. Pat. No. 6,366,103, entitled "Multiple Test Probe System", filed on Jul. 6, 1999, which is incorporated herein by reference. This application is also related to co-pending U.S. patent application Ser. No. 10/066,394, entitled "Indexing Multiple Test Probe System and Method", which is also incorporated herein by reference.

BACKGROUND OF THE INVENTION

The present invention relates to electronic testing systems, and more particularly to test probes for electronic testing systems.

The testing of samples is performed widely in the manufacture of products. For example, the manufacture and fabrication of integrated circuits begin with blank, unpatterned semiconductor wafers. These wafers undergo a number of critical testing steps before being processed and formed into the final integrated circuit form. For example, sheet resistance and wafer (substrate) thickness may be tested in the manufacturing process so that the bulk resistivity of a wafer can be determined.

Testing of sheet resistance, substrate thickness and other characteristics of a semiconductor wafer is often done using a probe assembly having a number of electrical contacts or pins capable of directing a constant current (I) through the film and reading the voltage drop (V) created across the film by the current. Sheet resistance may then be determined by Ohm's law ($R=K(V/I)$), after which the thickness of the substrate may be calculated using the sheet resistance and the known bulk resistivity ($\rho$) of the film. The constant K is determined by the geometry of the probes in the specific configuration.

Because semiconductor wafers are manufactured from many types of materials, each of which exhibit specific characteristics, a different type of probe assembly may be required for a particular application. For example, probe assemblies with sharper pins (i.e. types "A" or "B" probes) are used for metal film. The sharp pin is utilized because it is able to push into the metal for good contact. On the other hand, probe assemblies with duller pins (i.e. types "C" or "D" probes) are used, for example, for doped silicon applications. Using a dull pin to contact silicon reduces the chance of puncturing the surface of the wafer. Other applications of semiconductor testing require probe assemblies that vary the spacing between the pins and electrical contacts or probe assemblies that apply a different force to the wafer surface (e.g. a spring-loaded pin).

In the prior art, probe assemblies were changed every time a different type of probe was required by a specific application (for example, changing from a type A to a type C probe). Probes were also changed for different applications because of the danger of contamination.

The conventional method of changing probe assemblies is to change it by hand. One problem with associated with this technique is that it increases the risk of error during the operation of the probe assembly. Removal of a probe assembly results in unnecessary wear and tear, which could lead to errors in measurement. Contamination and damage of the delicate probe is also a risk.

Yet another problem inherent in the replacement of a probe test head by hand is that the electrical connection between the probe assembly and the microprocessor controller of the electronic testing system must be broken, therefore increasing the risk for error if the probe assembly is not properly replaced. In addition, the procedure for manually changing probe test heads is impractical. For example, in an automated wafer handling system, each wafer is loaded onto the measurement equipment from a wafer cassette using robotics. Therefore, operators would need to halt the operation of the wafer testing system each time a probe test head needs to be changed.

Because it takes several minutes to manually changing probe test heads, if such a change is needed, it takes much longer to test each individual wafer, decreasing the overall efficiency of the wafer testing system. The changing of probe assemblies is so inconvenient and time consuming that multiple wafer testing systems are often used at considerable additional expense to solve the problem, with each wafer testing system having a different probe assembly.

It is also of importance, in any system where probes are changed, to provide accurate and repeatable mechanical positioning following probe changes. This can be especially important in systems that produce multi-point resistivity maps on semiconductor test wafers, since computed resistivity uniformity may be impacted by probe position reproducibility. Prior art systems, in many cases, have relied solely upon electronic sensors to establish sensor location via switch closures, but this method is susceptible to long term position drift and therefore reliability problems. It also requires lengthy and frequent calibration procedures. It is therefore desirable to have mechanical "hard stop" positioning, with location verification via electronic sensors.

Despite the development of semiconductor technology and the importance of testing wafers accurately and efficiently, a convenient and reliable method and apparatus for changing test probe assemblies remain elusive. In view of the foregoing, what is needed is an efficient method and apparatus for changing probe assemblies for electronic testing systems.

SUMMARY OF THE INVENTION

The present invention fills this need by providing a method and apparatus for changing probe assemblies. Several inventive embodiments of the present invention are described below.

In one embodiment of the present invention a multiple test probe system is disclosed. The system includes a support, a probe bus comprising a plurality of wires, and a mount pivotally coupled to the support and capable of pivoting to a plurality of testing positions. A plurality of probe assemblies coupled to the mount and associated with the plurality of testing positions, wherein each of the probe assemblies include a plurality of electrical contacts coupled to the plurality of wires of the probe bus regardless of a testing position of the mount. A plurality of n actuators forming an actuator assembly, each of which has a drive member having two operative positions, including a base actuator coupled to the mount, and at least one supported actuator supported by the drive member whereby the actuator assembly can attain $2^n$ test positions.

In another embodiment of the present invention the base actuator having a first travel and the at least one supported actuator having a second travel, the second travel being twice the first travel, is disclosed.

In another embodiment of the present invention a plurality of position sensors mounted on the plurality of n actuators, wherein at least one of the plurality of position sensors is activated to verify when at least one of the plurality of probe assemblies is in the testing position, is disclosed.

In another embodiment of the present invention at least one of the plurality of position sensors is at least one of a micro-switch, an optical sensor, and a magnetic sensor.

In another embodiment of the present invention each of the plurality of probe assemblies comprising four electrical contacts is disclosed.

In another embodiment of the present invention the electrical contacts are coupled to the probe bus in parallel.

In another embodiment of the present invention at least one of the plurality of n actuators is a stepper motor system.

In another embodiment of the present invention the stepper motor system is controlled by a microprocessor.

In another embodiment of the present invention, a method for providing a multiple test probe system is disclosed. The method includes providing a support, providing a probe bus comprising a plurality of wires, providing a mount pivotally coupled to the support and capable of pivoting to a plurality of testing positions, and providing a plurality of probe assemblies coupled to the mount and associated with the plurality of testing positions. Each of the probe assemblies includes a plurality of electrical contacts coupled to the plurality of wires of the probe bus regardless of a testing position of the mount. The method further provides a plurality of n actuators forming an actuator assembly, each of which has a drive member having two operative positions, including a base actuator coupled to the mount, and at least one supported actuator supported by the drive member whereby the actuator assembly can attain $2^n$ test positions.

In another embodiment of the present invention, a method for providing a multiple test probe system comprising providing the base actuator having a first travel and the at least one supported actuator having a second travel, the second travel being twice the first travel, is disclosed.

In another embodiment of the present invention, a method for providing a multiple test probe system comprising providing a plurality of position sensors mounted on the plurality of n actuators, wherein at least one of the plurality of position sensors is activated to verify when at least one of the plurality of probe assemblies is in the testing position, is disclosed.

In another embodiment of the present invention, a method for providing a multiple test probe system comprising providing at least one of the plurality of position sensors from at least one of a micro-switch, an optical sensor, and a magnetic sensor is disclosed.

In another embodiment of the present invention, a method for providing a multiple test probe system comprising providing four electrical contacts for each of the plurality of probe assemblies is disclosed.

In another embodiment of the present invention, a method for providing a multiple test probe system comprising coupling the electrical contacts to the probe bus in parallel is disclosed.

In another embodiment of the present invention, a method for providing a multiple test probe system comprising providing a stepper motor system for at least one of the plurality of n actuators is disclosed.

In another embodiment of the present invention, a method for providing a multiple test probe system comprising controlling the stepper motor system by a microprocessor is disclosed.

In another embodiment of the present invention, a method for providing a number of electrical probe assemblies is disclosed. The method includes providing a number of test probe assemblies arranged such that only one of the probe assemblies can be in a testing position at one time. A desired probe assembly is determined, and then moved to the testing position if it is not already in position. The desired probe assembly is then engaged with a sample to be tested. Testing signals are then provided to all of the probe assemblies, such that test result signals are received only from the desired probe assembly due to its engagement with the sample.

One advantage of the present invention is that it allows a multiple probe system to efficiently change probe assemblies for different applications. The present invention eliminates the need to change probe assemblies by hand and further eliminates the need to dedicate more than one multiple probe system to different applications that require different types of probe assemblies. Another advantage of the present invention is that it reduces the chance of both wear and error because the electrical contacts of the probe assemblies are coupled to the probe bus regardless of the position of the mount.

These and other advantages of the present invention will become apparent to those skilled in the art upon reading the following detailed description of the invention and studying the accompanying drawings.

DETAILED DESCRIPTION OF THE PREFERRED EMBODIMENT(S)

A method and apparatus for efficiently changing probe test heads that contact a substrate is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
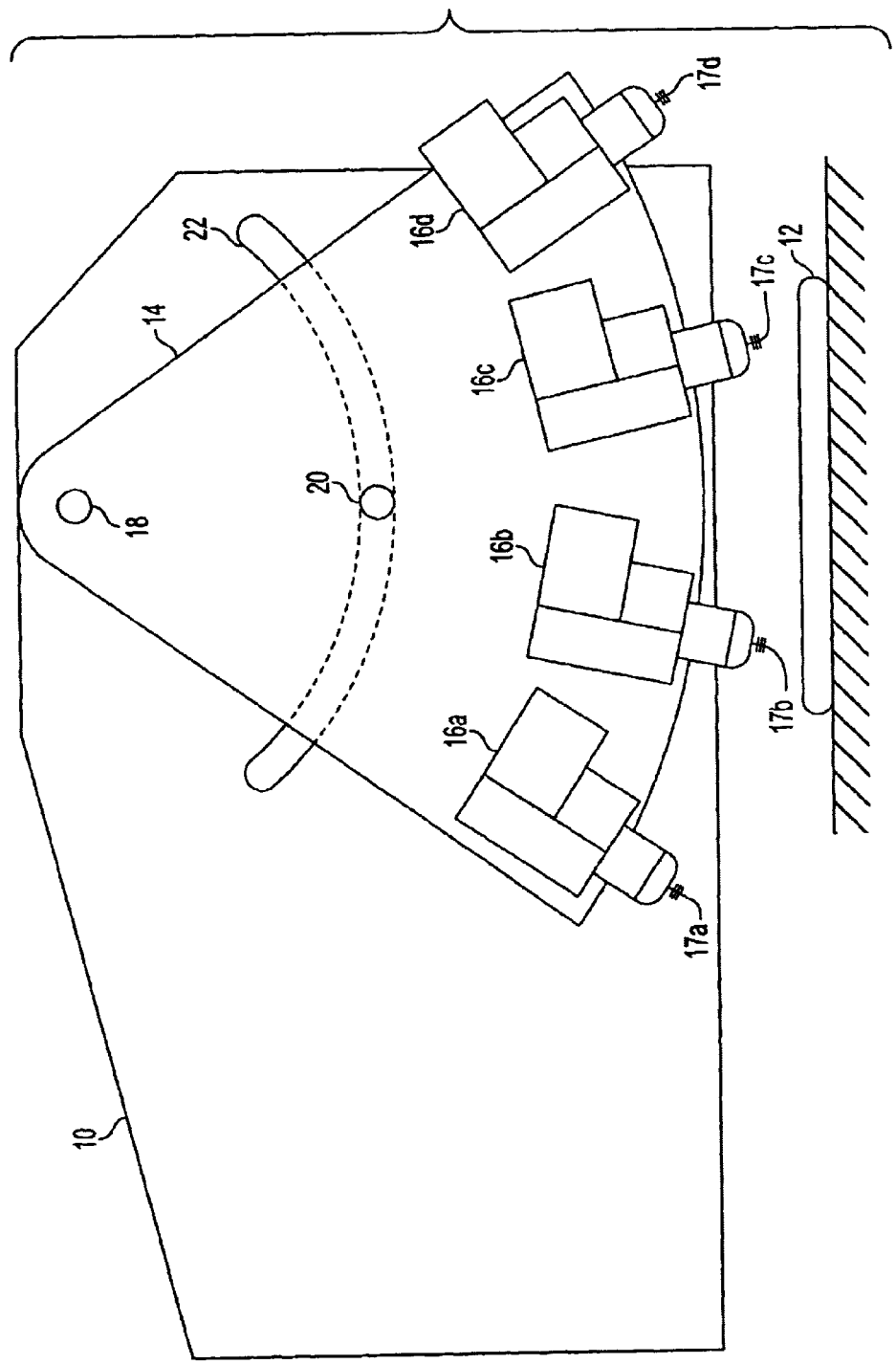
FIG. 1 is a front elevational view of a multiple test probe system employing linear actuators in accordance with one embodiment of the present invention.

FIG. 1 is a front elevational view of a multiple test probe system employing linear actuators in accordance with one embodiment of the present invention. The multiple test probe system includes a support plate 10 to which a probe mount 14 is attached via pivot 18. Probes 16a–d are fixed to mount 14. Mount 14 is moved to various test positions by an actuator assembly (hidden from view) acting on drive pin 20 through slot 22. Testing is accomplished by placing any of the probes 16 normal to the surface of the test substrate 12 and contacting with probe electrical contacts 17. Although four probes are illustrated in this example, the principle can be easily extended to provide for more than four probes, as will be appreciated by those skilled in the art and as discussed below.

Figure 2:
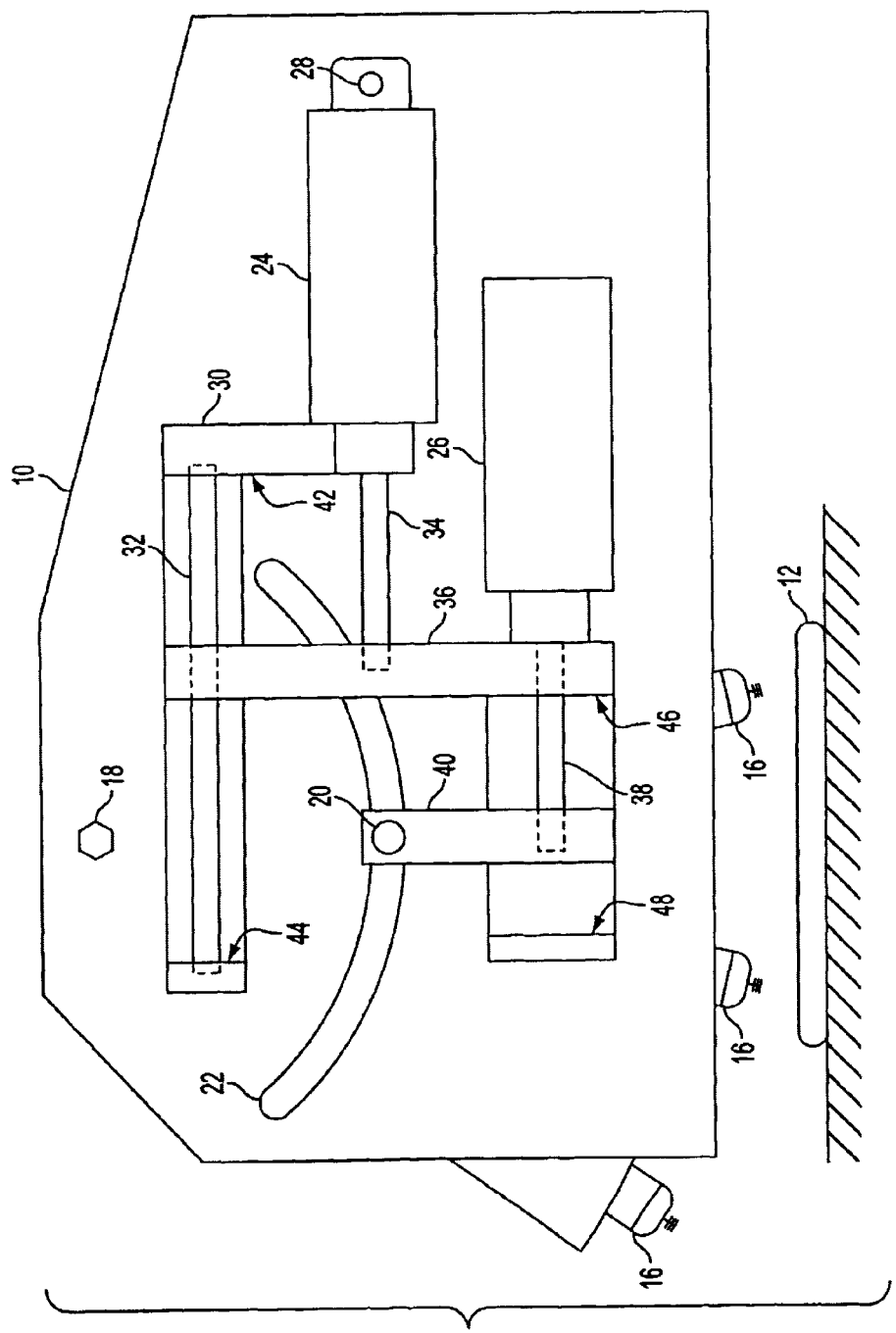
FIG. 2 is a rear elevational view of a multiple test probe system employing linear actuators in accordance with one embodiment of the present invention.

FIG. 2 is a rear elevational view of the multiple probe system of FIG. 1. The mechanical logic required to position the four probes shown in FIG. 1 are provided by two linear actuators 24 and 26. Linear actuator 24 is attached via pivot 28 to support plate 10, and rigidly fixed to guide bracket 30. Actuator shaft 34 of linear actuator 24 is fixed to a second guide bracket 36, which slides on guide rod 32 in response to linear extension and retraction of shaft 34. Linear actuator 26 is fixed to second guide bracket 36, and has an actuator shaft 38 fixed to pivot drive 40. Drive pin 20 is fixed to pivot drive 40, and moves probe mount 14 (not shown) through slot 22 in response to the combined extensions of shafts 34 and 38. Accurate positioning of the various probes is obtained by driving linear actuators 24 and 26 to hard stops 42,44,46 and 48. This allows the use of low cost linear actuators, i.e. pneumatic actuators. Alternatively, motor driven actuators may also be used if desired.

FIGS. 3a–h show front and rear elevational views of the multiple probe system employing linear actuators in each of the four test positions. Certain items have been removed for clarity, such as the test substrate 12 and surface indications 42–48 (please refer to FIG. 2). The actuators 24 and 26 combined with guide brackets 30 and 36 produce four approximately equally spaced angular positions of drive pin 20, corresponding to the proper test positions of each of the four probes 16. Guide bracket 30 is made such that the distance between hard stop surfaces 44 and 42 is approximately twice that of the distance between hard stop surfaces 46 and 48 of guide bracket 36. Thusly, four mechanical logic states are created corresponding to four separate probe measurement positions. These are outline in Table 1 below.

TABLE 1

Figure 3A:
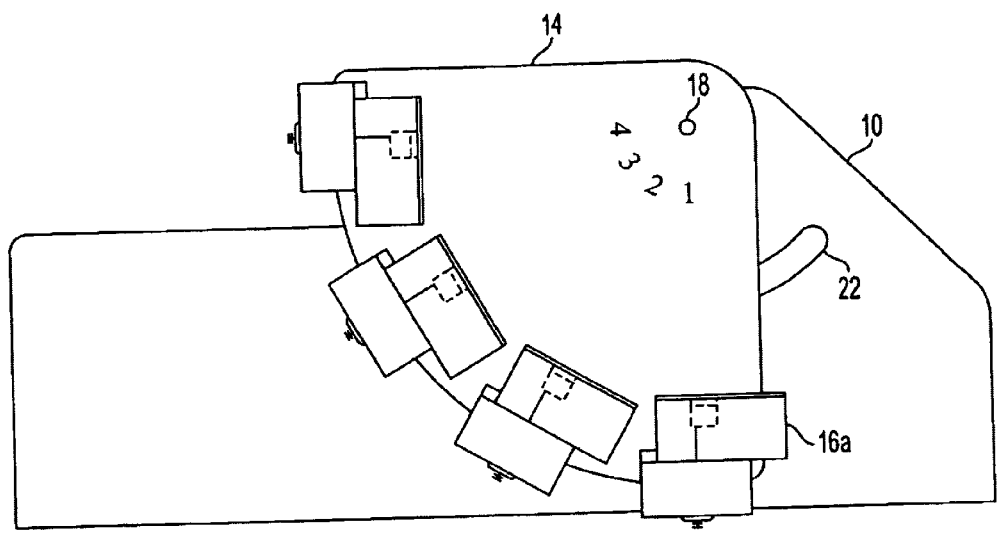
FIGS. 3a–h is front and rear elevational views of the test probe system of FIGS. 1 and 2 at each of the test probe positions in accordance with one embodiment of the present invention.
Figure 3B:
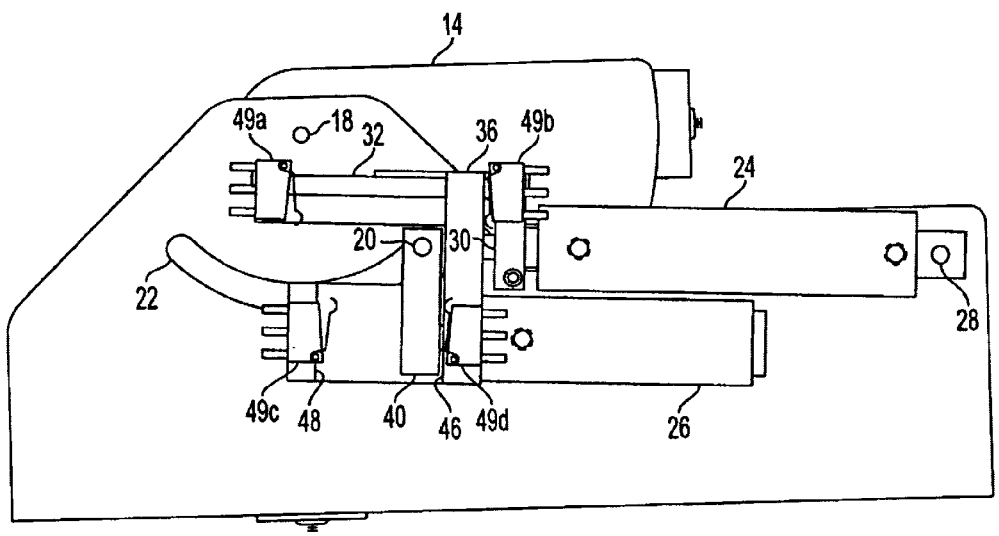
Figure 3C:
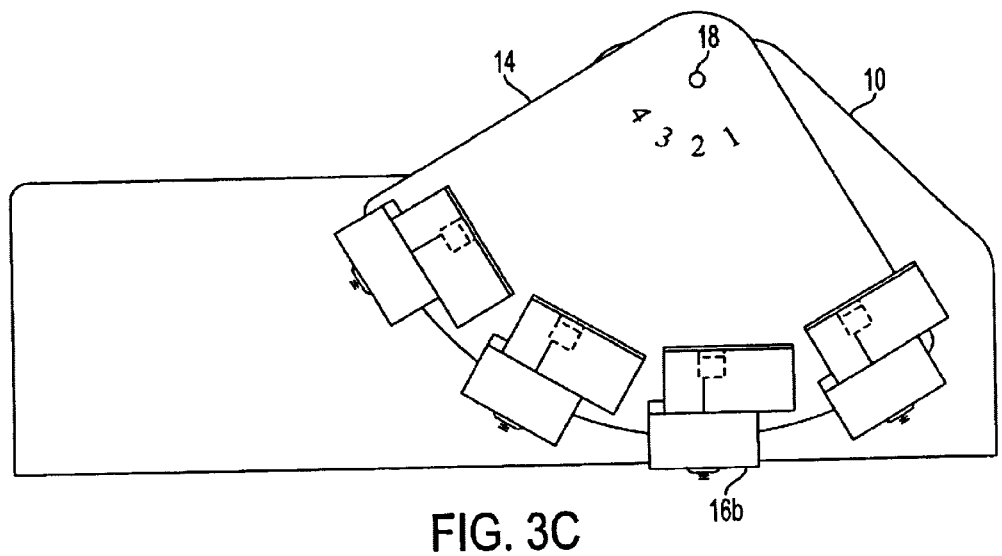
Figure 3D:
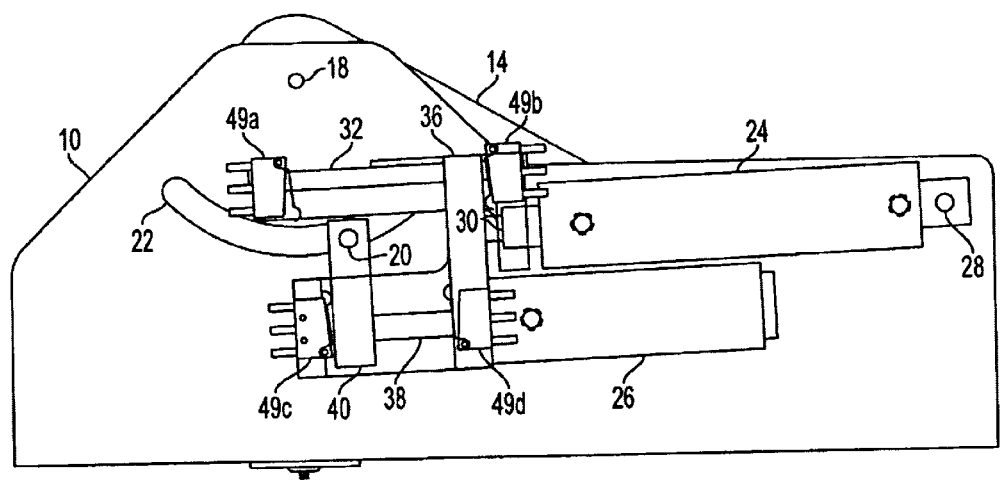
Figure 3E:
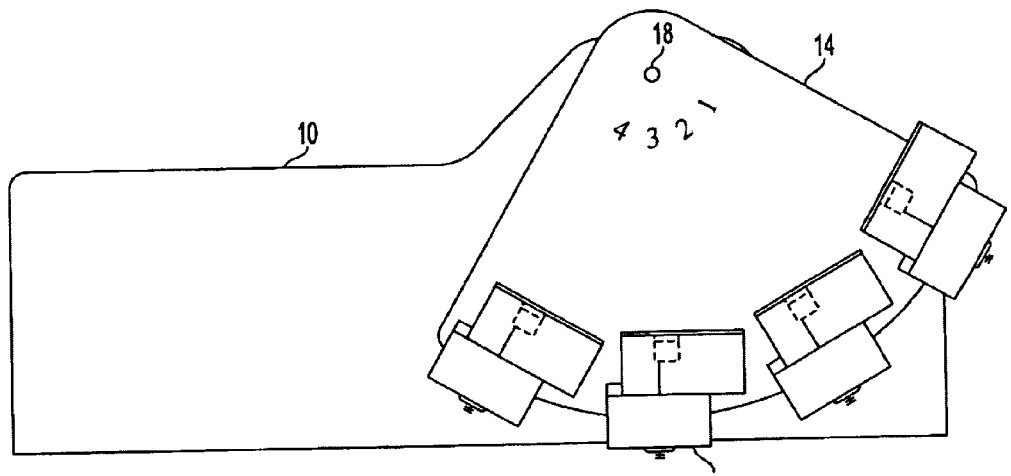
Figure 3F:
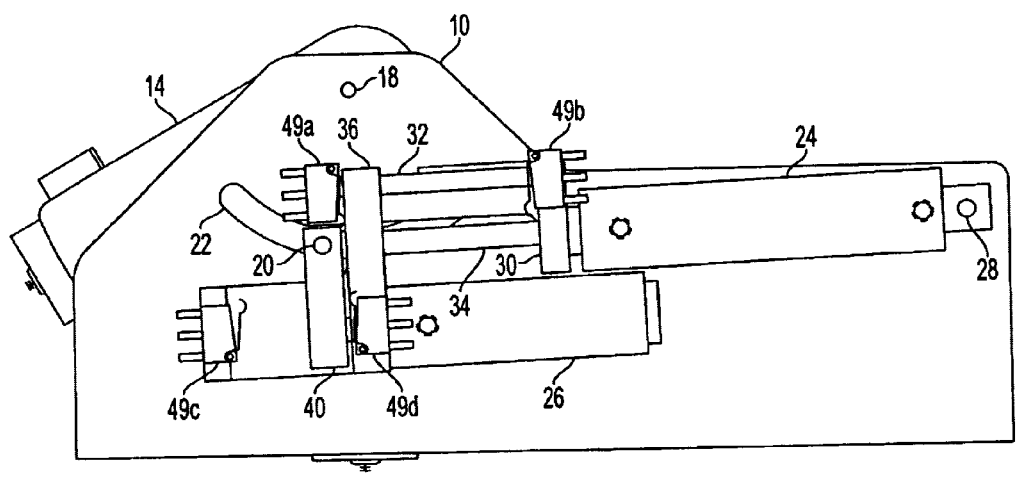
Figure 3G:
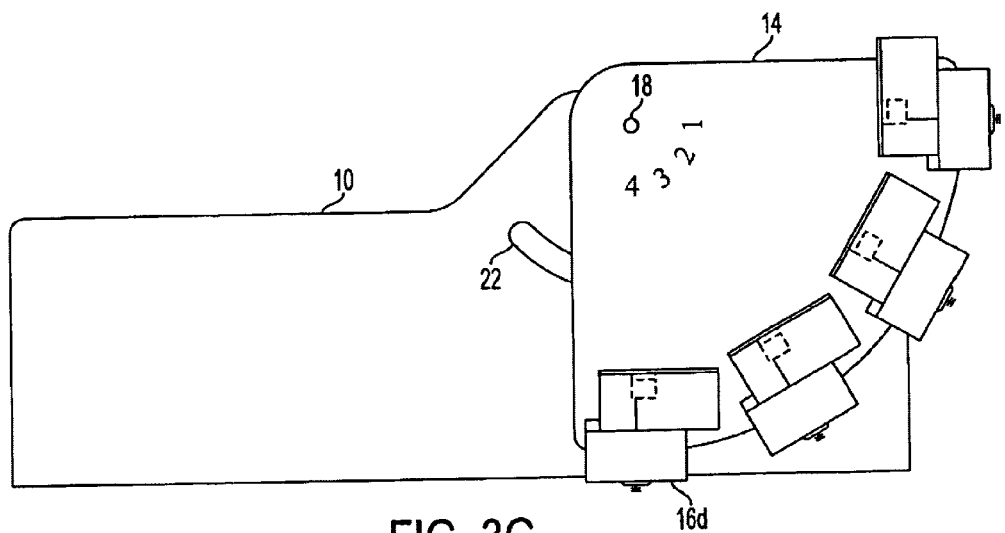
Figure 3H:
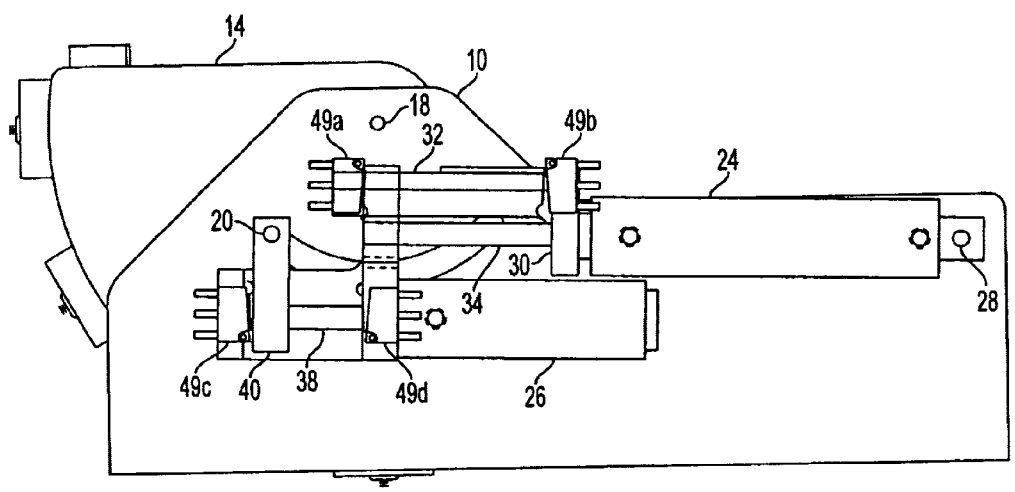

| Position | FIGS. | Actuator 24 | Actuator 26 | Description |
|---|---|---|---|---|
| 1 | FIG. 3a, 3b | Retracted | Retracted | guide bracket 36 against hard stop 42<br>pivot drive 40 against hard stop 46 |
| 2 | FIG. 3c, 3d | Retracted | Extended | guide bracket 36 against hard stop 42<br>pivot drive 40 against hard stop 48 |
| 3 | FIG. 3e, 3f | Extended | Retracted | guide bracket 36 against hard stop 44<br>pivot drive 40 against hard stop 46 |
| 4 | FIG. 3g, 3h | Extended | Extended | guide bracket 36 against hard stop 44<br>pivot drive 40 against hard stop 48 |

Position sensors 49a–d shown in FIGS. 3a–h may be provided, but are not required, at each of the four hard stop locations to verify actual position. Micro-switches are illustrated, however these sensors may also be optical or magnetic. For the case of magnetic or optical sensors, flags attached to pivot drive 40 and guide bracket 36 would engage sensors mounted in the vicinity of hard stop locations 42–48.

The addition of a third actuator would provide for up to eight probes, and a fourth actuator 16 probes, etc. The effective travel of the third actuator would preferably be twice that of actuator 24, and the travel of a fourth actuator would preferably be twice that of the third actuator, to maintain the binary mechanical logic. As will be appreciated by those skilled in the art, further extension to more than 16 probes is limited only by the size and complexity tolerable in the final apparatus.

Figure 4A:
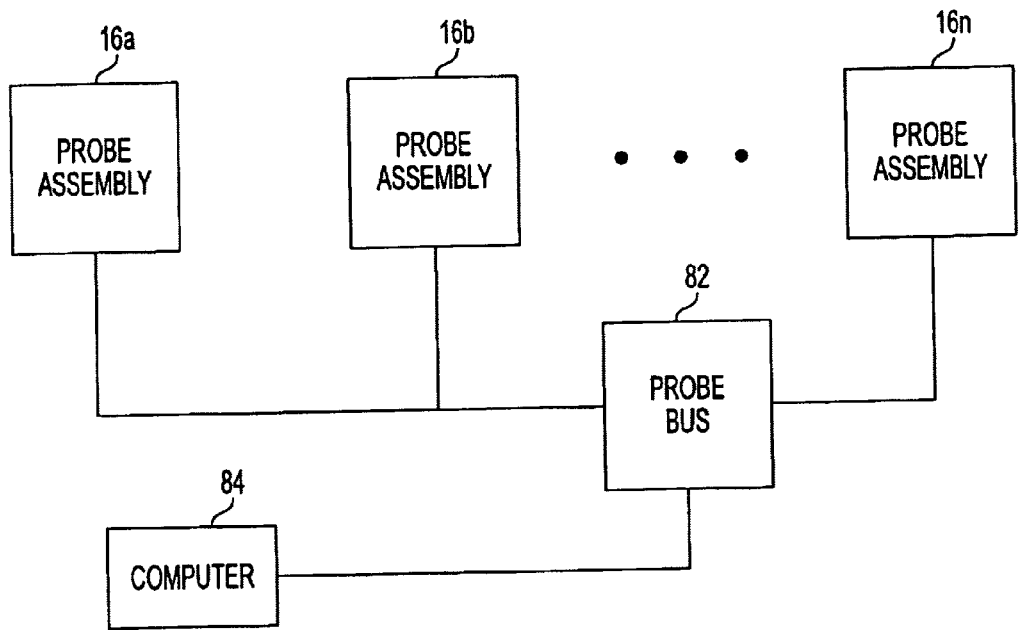
FIG. 4a is a block diagram of the wiring of the probe assemblies to the probe bus in accordance with one embodiment of the present invention.

FIG. 4a is a block diagram of the wiring of probe assemblies 16a–n to a probe bus 82 in accordance with one embodiment of the present invention. It is in this manner that each probe assembly 16 is coupled to probe bus 82 regardless of a testing position of the other probe assemblies 16. Probe assemblies 16a–n are preferably coupled to probe bus 82 in parallel. By "in parallel" it is meant that probe assemblies 16a–n are continuously coupled to a common bus, and not that there is a pin for pin parallelism between probe assemblies 16a–n. Probe bus 82 is then coupled to a computer 84.

Figure 4B:
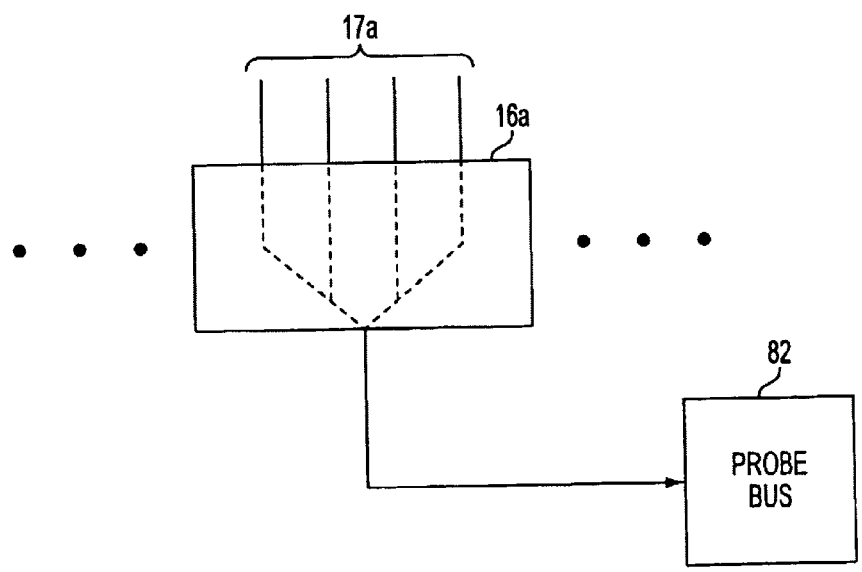
FIG. 4b is a detailed illustration of a probe assembly in accordance with one embodiment of the present invention.

FIG. 4b is a detailed illustration of a probe assembly 16 in accordance with one embodiment of the present invention. For exemplary purposes, probe assembly 16 is coupled to four electrical contacts 17 in parallel. Only the specific set of electrical contacts 17 that is in contact with semiconductor wafer 12 will make the electrical connection. For example, if probe assembly 16a is in testing position, then electrical contacts 17a will make the electrical connection to a lower resistance surface of the workpiece, while all other sets of electrical contacts 17b–n remain at high impedance (in contact only with the air). Therefore, there is no need to switch circuits for the wiring as long as the surface measurement is of lower impedance than the open circuit probes, although it may be desirable to switch circuits in other applications.

Figure 5:
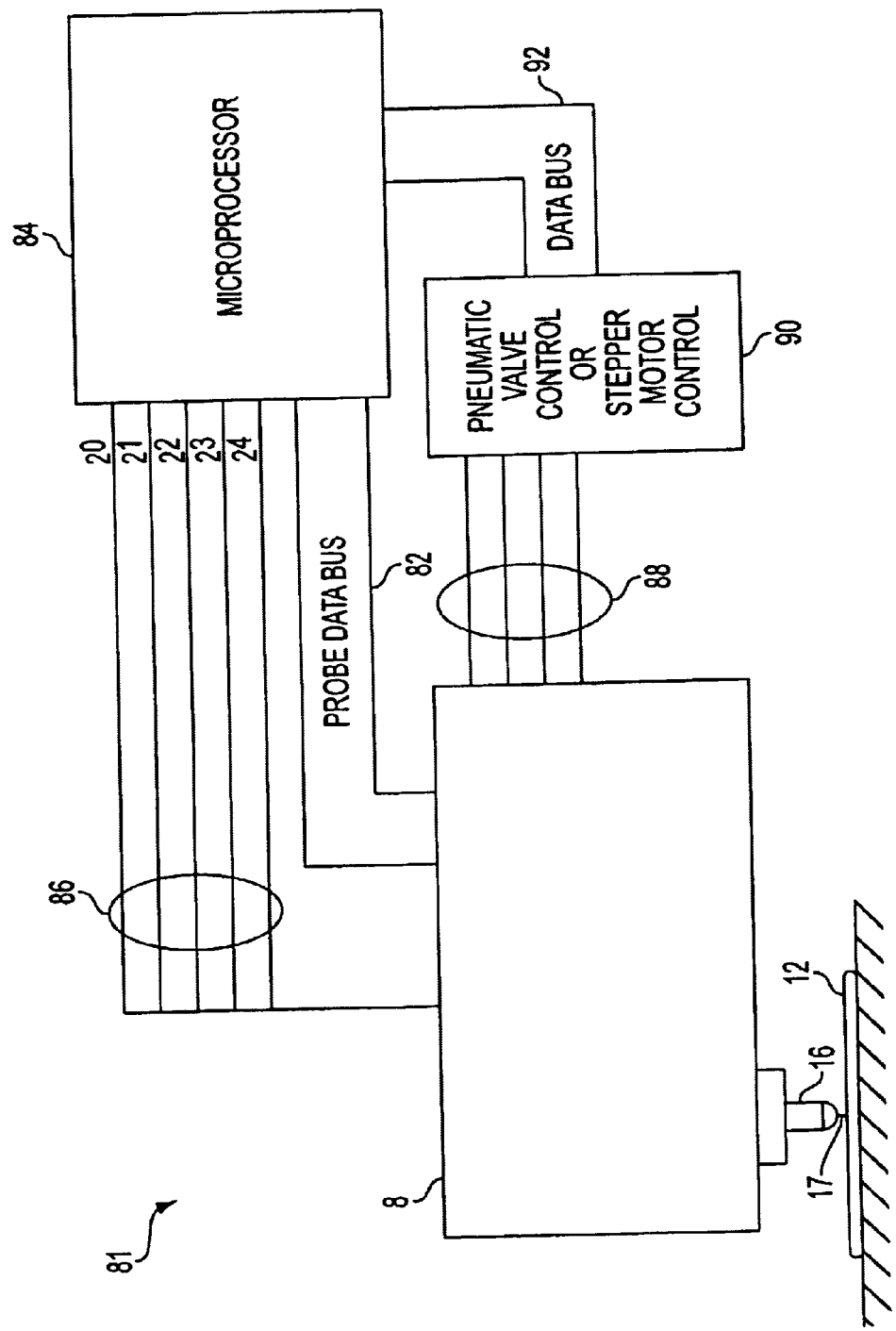
FIG. 5 is a microprocessor or a computer connected to multiple probe system in accordance with one embodiment of the present invention.

FIG. 5 is a detailed illustration of a multiple test probe control system 81. A microprocessor or computer 84 connected to multiple probe system 8 in accordance with one embodiment of the present invention. Computer 84 may be used to control the operation of multiple probe system 8 by determining the position of probe assemblies 16 through signals received from position sensors via position sensor bus 86. As mentioned previously, these may be signals from separate sensors for each probe position, but preferably are a binary code representing probe position as illustrated in FIGS. 3a–h. Computer 84 may then move probe assemblies 16 into testing position by sending the appropriate command signals via data bus 92 to controller 90. Depending on the type of actuator used, controller 90 may be a standard motor controller, stepper motor controller, or pneumatic valve controller. Signals from controller 90 are coupled to actuators in the multiple probe system 8 via signal bus 88. For the case of stepper motors or standard motors, signal bus 88 would be comprised of electrical wires. For the case of pneumatic actuators, signal bus 88 would be comprised of fluid lines connected to the actuators.

Figure 6:
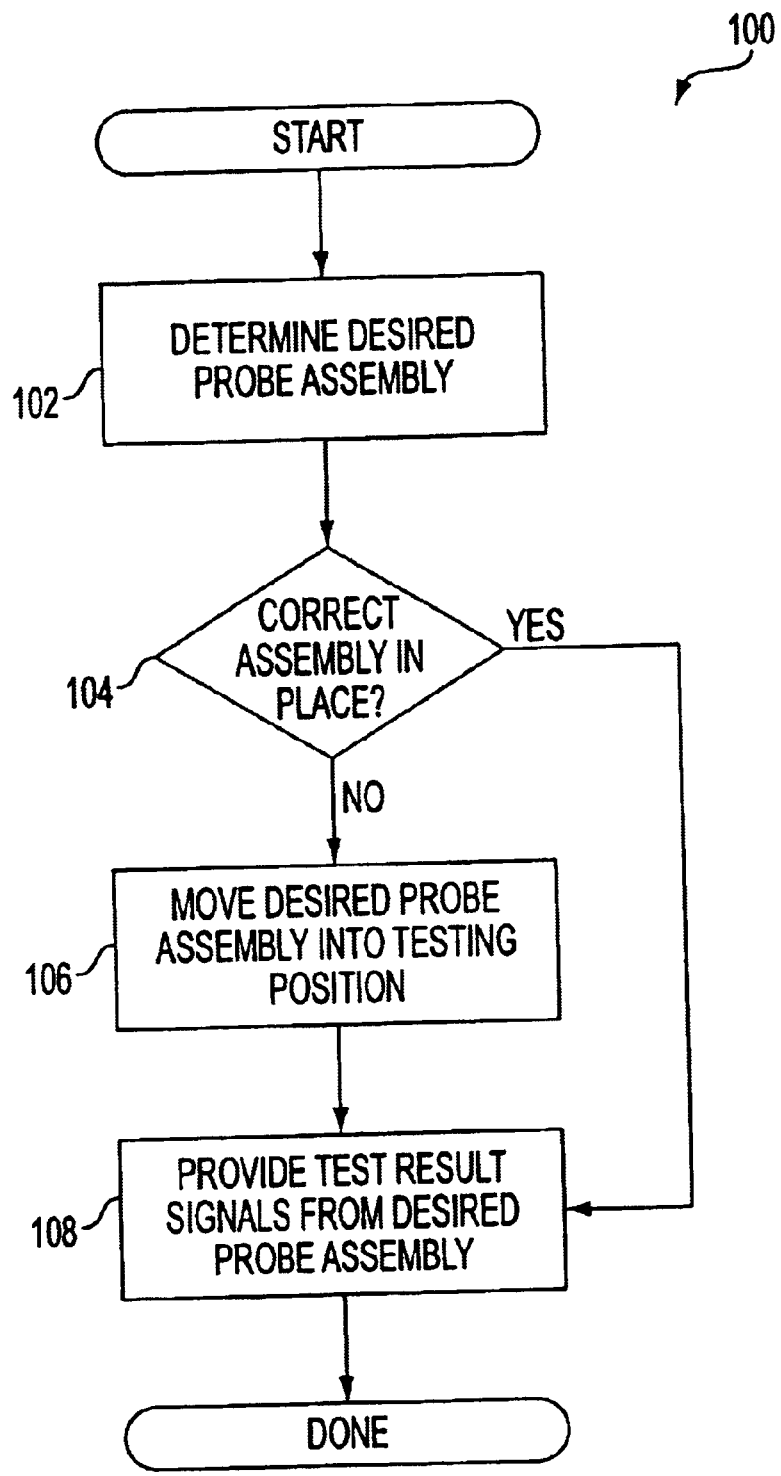
FIG. 6 is a flow chart illustrated a method of determining and changing to a desired probe assembly in accordance with one embodiment of the present invention.

FIG. 6 is a flow chart illustrating a method 100 of determining and changing to a desired probe assembly in accordance with one embodiment of the present invention. Method 100 begins with an act 102 that determines a desired probe assembly. The desired probe assembly is typically determined by the wafer type and the wafer characteristic to be measured. For example, probe assemblies with sharper electrical contacts or pins (such as type A) are used for metal film measurements, while probe assemblies with duller pins (such as type C) are used for doped silicon applications.

In an act 104, a decision is made as to whether the correct probe assembly is in place. If the desired probe assembly as determined by act 102 is already in the correct testing position, as detected by the appropriate position sensor, then method 100 proceeds to an act 108 (discussed below). If the correct probe assembly is not already in place, then method 100 proceeds to an act 106 that and the desired probe assembly is moved into testing the position. An actuator rotates a mount supporting the probe assemblies until the correct probe assembly is in testing position as detected by the appropriate position sensor. Method 100 then proceeds to an act 108 in which test result signals containing, for example, information about the resistivity and thickness of the wafer, are provided from the desired probe assembly to a computer.

It will therefore be appreciated that the multiple test probe system of the present invention provides for these and other advantages that will become apparent to those skilled in the art upon reading the following detailed description of the invention and studying the accompanying drawings.

The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A multiple test probe system comprising:
    a support;
    a probe bus comprising a plurality of wires;
    a mount pivotally coupled to said support and capable of pivoting to a plurality of testing positions;
    a plurality of probe assemblies coupled to said mount and associated with said plurality of testing positions, wherein each of said probe assemblies include a plurality of electrical contacts coupled to said plurality of wires of said probe bus regardless of a testing position of said mount; and,
    a plurality of n actuators forming an actuator assembly, each of which has a drive member having two operative positions, including a base actuator coupled to said mount, and at least one supported actuator supported by said drive member whereby said actuator assembly can attain $2^n$ test positions.

2. A multiple test probe system as recited in claim 1 wherein said base actuator has a first travel and said at least one supported actuator has a second travel, said second travel being twice said first travel.

3. A multiple test probe system as recited in claim 1 further comprising a plurality of position sensors mounted on said plurality of n actuators, wherein at least one of said plurality of position sensors is activated to verify when at least one of said plurality of probe assemblies is in said testing position.

4. A multiple test probe system as recited in claim 3, wherein at least one of said plurality of position sensors is at least one of a micro-switch, an optical sensor, and a magnetic sensor.

5. A multiple test probe system as recited in claim 1, wherein each of said plurality of probe assemblies comprises four electrical contacts.

6. A multiple test probe system as recited in claim 1, wherein said electrical contacts are coupled to said probe bus in parallel.

7. A multiple test probe system as recited in claim 1, wherein at least one of said plurality of n actuators is a stepper motor system.

8. A multiple test probe system as recited in claim 7, wherein said stepper motor system is controlled by a microprocessor.

9. A method for providing a multiple test probe system comprising:
    providing a support;
    providing a probe bus comprising a plurality of wires;
    providing a mount pivotally coupled to said support and capable of pivoting to a plurality of testing positions;
    providing a plurality of probe assemblies coupled to said mount and associated with said plurality of testing positions, wherein each of said probe assemblies include a plurality of electrical contacts coupled to said plurality of wires of said probe bus regardless of a testing position of said mount; and,
    providing a plurality of n actuators forming an actuator assembly, each of which has a drive member having two operative positions, including a base actuator coupled to said mount, and at least one supported actuator supported by said drive member whereby said actuator assembly can attain $2^n$ test positions.

10. A method for providing a multiple test probe system as recited in claim 9 further comprising:
    providing said base actuator having a first travel and said at least one supported actuator having a second travel, said second travel being twice said first travel.

11. A method for providing a multiple test probe system as recited in claim 9 further comprising:
    providing a plurality of position sensors mounted on said plurality of n actuators, wherein at least one of said plurality of position sensors is activated to verify when at least one of said plurality of probe assemblies is in said testing position.

12. A method for providing a multiple test probe system as recited in claim 11 further comprising:
    providing at least one of said plurality of position sensors from at least one of a micro-switch, an optical sensor, and a magnetic sensor.

13. A method for providing a multiple test probe system as recited in claim 9 further comprising:
    providing four electrical contacts for each of said plurality of probe assemblies.

14. A method for providing a multiple test probe system as recited in claim 9 further comprising:
    coupling said electrical contacts to said probe bus in parallel.

15. A method for providing a multiple test probe system as recited in claim 9 further comprising:
    providing a stepper motor system for at least one of said plurality of n actuators.

16. A method for providing a multiple test probe system as recited in claim 15 further comprising:
    controlling said stepper motor system by a microprocessor.

* * * * *